United States Patent
Gupta et al.

(10) Patent No.: US 7,743,349 B2
(45) Date of Patent: Jun. 22, 2010

(54) METHOD AND SYSTEM FOR FINDING AN EQUIVALENT CIRCUIT REPRESENTATION FOR ONE OR MORE ELEMENTS IN AN INTEGRATED CIRCUIT

(75) Inventors: Puneet Gupta, Santa Clara, CA (US); Andrew B Kahng, Del Mar, CA (US)

(73) Assignee: Tela Innovations, Inc., Campbell, CA (US)

( * ) Notice: Subject to any disclaimer, the term of this patent is extended or adjusted under 35 U.S.C. 154(b) by 952 days.

(21) Appl. No.: 11/254,643

(22) Filed: Oct. 19, 2005

(65) Prior Publication Data
US 2006/0150132 A1 Jul. 6, 2006

Related U.S. Application Data

(60) Provisional application No. 60/640,917, filed on Dec. 31, 2004.

(51) Int. Cl.
*G06F 17/50* (2006.01)
(52) U.S. Cl. ............... 716/4; 716/2; 716/5; 716/19; 716/20; 716/21; 703/13; 430/5; 430/30
(58) Field of Classification Search ............. 716/19–21; 430/5, 30
See application file for complete search history.

(56) References Cited
U.S. PATENT DOCUMENTS

| | | | | |
|---|---|---|---|---|
| 6,706,452 B2 * | 3/2004 | Hayano et al. | ............ | 430/5 |
| 2003/0005390 A1 * | 1/2003 | Takashima et al. | ............ | 716/1 |
| 2003/0237064 A1 * | 12/2003 | White et al. | ............ | 716/5 |
| 2004/0229130 A1 * | 11/2004 | Baba-Ali | ............ | 430/5 |

OTHER PUBLICATIONS

"Backend CAD Flows for Restrictive Design Rules", by Mark Lavin, Fook-Luen Heng, Greg Northrop @ IEEE, Nov. 7, 2004.*
"Physical & Timing Verification of Subwavelength-scale Designs—Part 1: lithography Impact on MOSFETs" by Robert Pack, Valery Axelrad, Andrei Shibkov, Victor Boksha, Judy Huckabay, Rachid Salik, Wolf Staud, Ruoping Wang, Warren Grobman, Proceedings of SPIE vol. 5042 @2003.*
Balasinski, et al, Impact of Subwavelength CD Tolerance on Device Performance, Design, Process Integration, and Characterization for Microelectronics, Proceedings of the SPIE, Jul. 2002, pp. 361-368, vol. 4692.
Heng, et al, Toward Througn-Process Layout Quality Metrics, Data Analysis and Modeling for Process Control II, Proceedings of the SPIE, May 2005, pp. 161-167, vol. 5756.

* cited by examiner

*Primary Examiner*—Thuan Do
*Assistant Examiner*—Nha T Nguyen
(74) *Attorney, Agent, or Firm*—Martine Penilla & Gencarella LLP

(57) ABSTRACT

The present invention provides a method and a system for designing an integrated circuit comprising a plurality of elements. The method includes obtaining a lithography-simulated layout corresponding to at least one element. The lithography-simulated layout accounts for lithography effects on the element. The method further includes determination of an equivalent circuit representation that is compatible to a circuit analysis tool, corresponding to the lithography-simulated layout with respect to one or more performance characteristics and based on user preferences. The method also provides equivalent circuit representation to the circuit analysis tool that analyzes one or more performance characteristics of the elements.

13 Claims, 10 Drawing Sheets

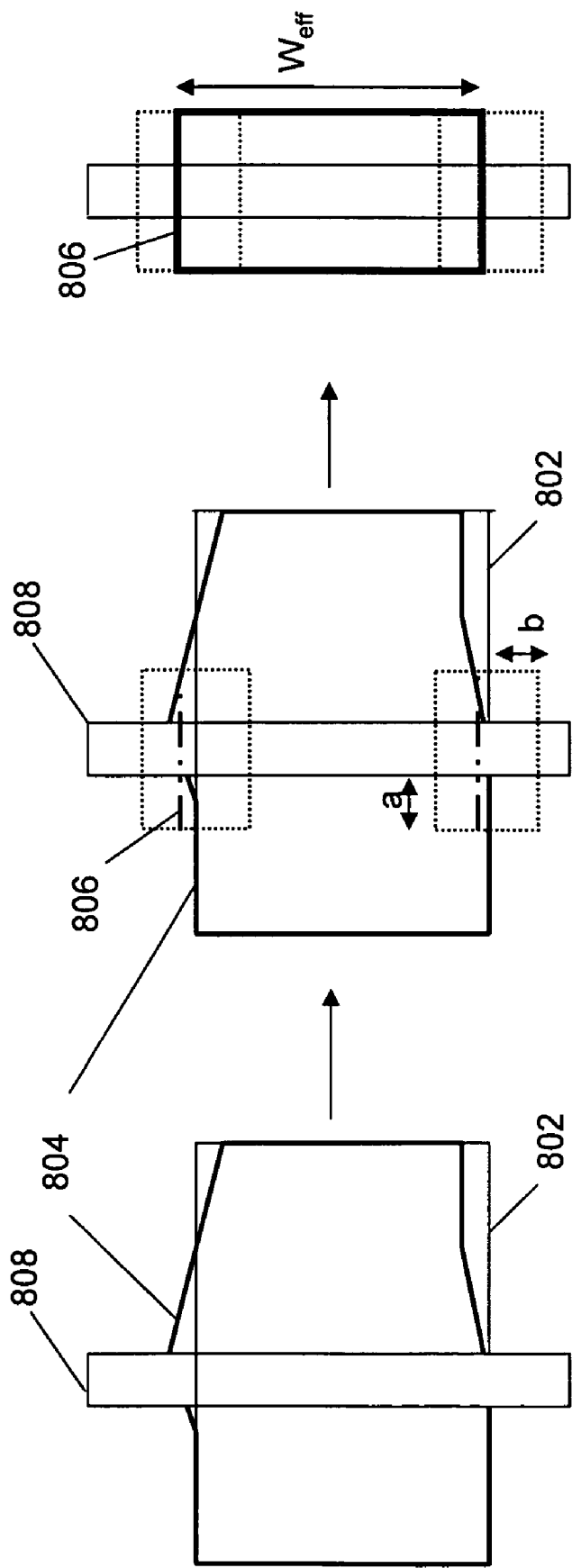

METHOD AND SYSTEM FOR FINDING AN EQUIVALENT CIRCUIT REPRESENTATION FOR ONE OR MORE ELEMENTS IN AN INTEGRATED CIRCUIT

CLAIM OF PRIORITY

This application claims priority of U.S. provisional application Ser. No. 60/640,917 filed Dec. 31, 2004, entitled System and Method for Calculation and Use of Equivalent Shapes in the Design of Integrated Circuits

BACKGROUND OF THE INVENTION

1. Field of the Invention

This invention relates generally to the design of integrated circuits (ICs), and more particularly, to the performance analysis of ICs.

2. Description of the Related Art

In the manufacture of modern integrated circuits, the size of circuit elements has been reduced to the nanometer scale. Each new technological advancement entails tighter manufacturing process control requirements. For example, in the optical lithography process, circuit element sizes are significantly smaller than the wavelength of light used in optical lithography, resulting in a "sub-wavelength lithography" regime. This requires advanced photomasks that embody one or more reticle enhancement techniques, such as optical proximity correction of mask aperture shapes, the insertion of sub-resolution assist circuit elements, phase-shifting, and so forth.

However, not even leading-edge photomask making and other related technologies can compensate for unavoidable manufacturing process variations. These variations include, notably, variations in focus and dose amount. Variations in focus (i.e., "defocus") are errors in the positioning of the ideal image plane relative to the wafer. The dose amount is the amount of radiant energy that reaches the wafer surface. As a result of such process variations, the integrated circuit element shapes printed on the wafer often fail to match the element shapes drawn by the designer with an acceptable level of accuracy. The element shapes drawn by the designer are simulated with respect to photomask and/or process steps before they are actually printed on the wafer. This simulation, which we refer to generically as "lithography simulation", generates "lithography-simulated shapes", or, simply, "printed shapes" that serve as predictions of the actual printed shapes on the wafer. Correct verification of the IC design should typically require that the element shapes, as printed on the wafer, i.e., the lithography-simulated shapes and not the shapes drawn by the designer, are analyzed to determine the performance parameters of the IC. These performance parameters include the actual static power, dynamic power, total power, signal delay, signal integrity, circuit timing, reliability, manufacturing yield, and other performance characteristics.

The lithography-simulated shapes can be irregular, and known circuit analysis tools are unable to handle the complexity of these shapes efficiently. For example, circuit simulators, such as HSPICE™ from Synopsys, typically require transistors to be composed entirely of rectangles. Parasitic extractors, such as Raphael™ from Synopsys, QuickCap™ from Magma, Star-RCXT™ from Synopsys, and Fire & Ice™ from Cadence, are typically also limited to a small set of primitive shapes that are defined by axis-parallel edges. Since the underlying computer data structures and algorithms are dramatically simplified and have faster runtimes when straight-line edges and/or axis-parallel edges are assumed, existing circuit analysis tools have been limited to these types of primitive shapes. These circuit analysis tools cannot inherently analyze complex lithography-simulated shapes. Further, the runtime of parasitic extractors, critical-area analysis tools, and other analysis tools generally increases monotonically with the total number of vertices or edges in the set of input shapes.

These limitations effectively prevent analysis and optimization of the IC design, based on the lithography-simulated shapes. This discrepancy, with respect to the circuit elements on the polysilicon layer of the IC, can result in inaccurate transistor dimensions being used in performance analysis. Inaccurate wire widths may be used with respect to circuit elements on the interconnect layers. With respect to circuit elements on contacts/vias layers, the outcome can be an inaccurate coverage area, resulting in incorrect evaluations of reliability and resistance. Overall, these limitations can result in inaccuracy in analyses and optimizations of the IC design, including, but not limited to, those addressing system performance and power, and loss of performance and parametric yield in manufactured ICs.

Therefore, there is a need for a method and a system and that can analyze an IC for various performance characteristics, based on the lithography-simulated IC circuit elements rather than on the drawn layout of those circuit elements. The method and system should be capable of being used in the design cycle, to iterate the design of the IC, and make use of existing and known circuit analysis tools.

SUMMARY OF THE INVENTION

An object of the invention is to analyze an IC for various performance characteristics, based on the lithography-simulated layouts of the elements in the IC, rather than on the drawn layouts.

Another object of the invention is to reduce the processing time of the analysis of the lithography-simulated layouts by the circuit analysis tools.

Various embodiments of the present invention provide a method and a system for designing an IC comprising a plurality of elements. In accordance with an embodiment, the method includes obtaining a lithography-simulated layout corresponding to at least one element in the IC. The lithography-simulated layout accounts for the lithography effects on the at least one element. An equivalent circuit representation corresponding to the lithography-simulated layout, with respect to one or more performance characteristics and based on user preferences, is determined. The equivalent circuit representation is in a form suitable for use by a circuit analysis tool. The method further includes providing the equivalent circuit representation to the circuit analysis tool, which analyzes the relevant performance characteristic of the at least one element.

In accordance with an embodiment, the system includes a mapping engine coupled to an equivalence module. The mapping engine determines at least one equivalent element representation, corresponding to at least one element of a given lithography-simulated layout, with respect to one or more performance characteristics. The equivalence module determines an equivalent circuit representation corresponding to the lithography-simulated layout, based on user preferences, and the at least one equivalent element representation. The equivalence module also provides the equivalent circuit representation to the circuit analysis tool, for analysis of the one or more performance characteristics of the elements.

The present invention generates equivalent circuit representations for the drawn layouts of the designer in such a manner that they account for the lithography effects on the elements. Further, the present invention also generates the at least one from an equivalent layout, an equivalent circuit netlist, and a parasitic netlist such that they are comprehensible to the circuit analysis tool, which analyze the elements on certain performance characteristics.

BRIEF DESCRIPTION OF THE DRAWINGS

So that the manner in which the above recited elements of the present invention can be understood in detail, a more particular description of the invention, briefly summarized above, may be had by reference to various embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 8A, 8B and 8C are diagrams illustrating the calculation of the effective width of a gate, in accordance with an embodiment of the present invention.

DETAILED DESCRIPTION OF THE INVENTION

Figure 1:
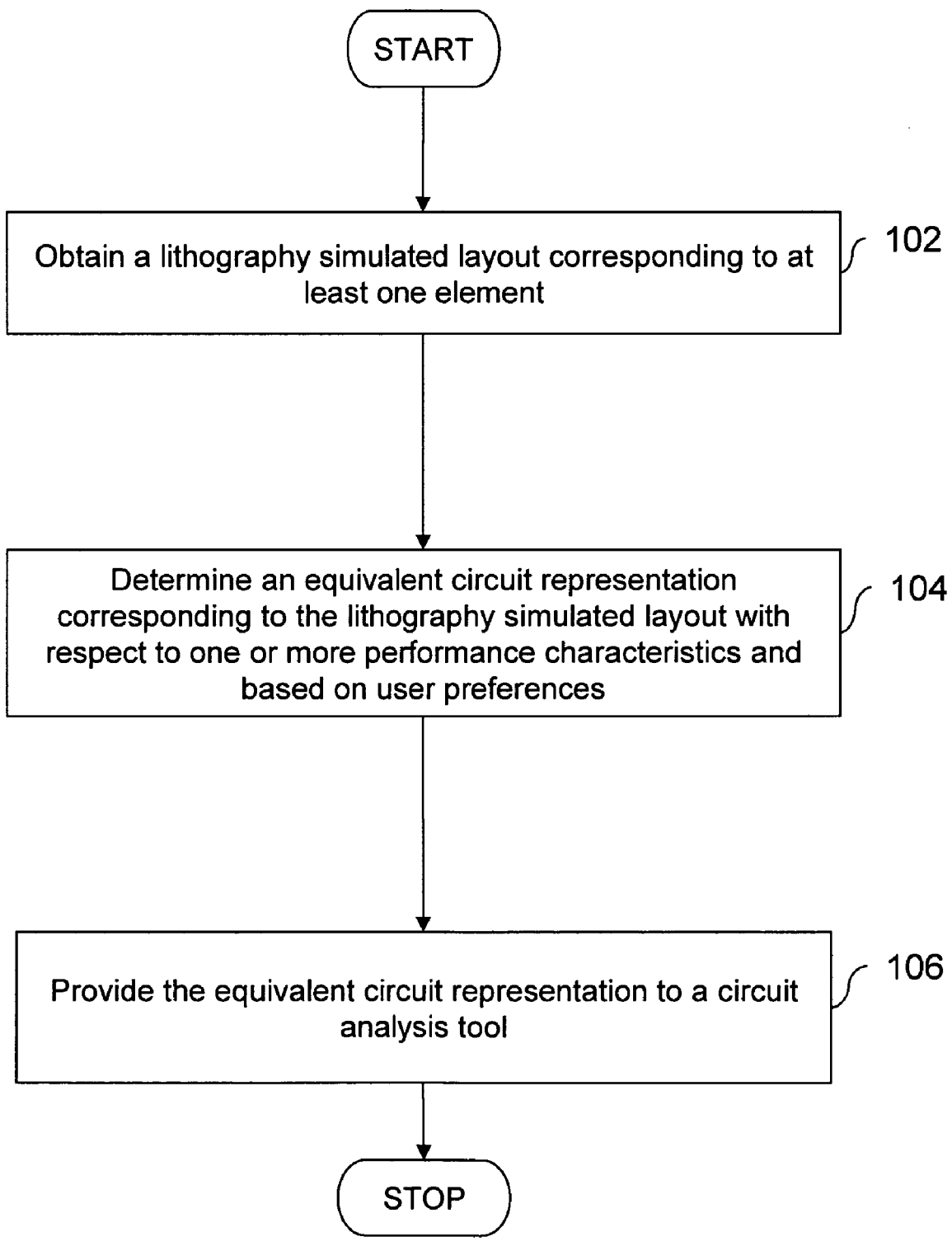
FIG. 1 is a flowchart of a method for designing an integrated circuit, in accordance with an embodiment of the present invention.

In a conventional approach for designing an integrated circuit (IC), the IC is represented by a drawn layout. The drawn layout is a description of the ideal, physical layout of the IC or circuit elements on the IC. GDSII is a common format for the drawn layout. In an ideal situation, the lithography-simulated layout of the circuit elements would match their drawn layout. Examples of circuit elements include a poly gate, a poly interconnect, a contact, a metal interconnect via or any other feature present in the layout of the integrated circuit. The circuit elements are hereinafter referred to as elements. The drawn layout may be referred to as a pre-lithography layout, since it is a representation of the IC, without accounting for lithography effects on the IC. The lithography-simulated layout, on the other hand, is a simulation of lithography effects on the drawn layout before the actual lithography, i.e., manufacturing or printing on the wafer, is performed on the elements.

In the conventional approach, the drawn layout is used as an input to a circuit analysis tool that predicts the performance of the IC. The circuit analysis tool typically takes as input a set of elements on one or more layers of the IC, and performs tasks such as parasitic extraction, delay calculation, timing analysis, for example, setting up time slack analysis or hold time slack analysis; and power calculation, for example, dynamic power and leakage power. Parasitic extraction and delay analysis technologies, in turn, provide the foundation for an analysis of additional performance characteristics, including but not limited to, signal integrity analysis, noise analysis, power and thermal analysis, and reliability analysis.

In the above-mentioned cases, the circuit analysis tool analyzes the performance characteristics of the IC, based on its drawn layout, and not on the lithography-simulated layout. Consequently, the analysis does not account for lithography effects or other differences between the drawn and lithography-simulated layouts. This results in inaccuracy in its predicted performance characteristics. However, the present invention accounts for these differences. The drawn layout is fed as an input to an Optical Proximity Correction (OPC) tool such as Calibre™ from Mentor Graphics or Proteus™ from Synopsys, or any other commercial OPC tool. The OPC tool makes local shape adjustments to the drawn layout. In other words, the OPC tool attempts to pre-distort the drawn layout, so that, after undergoing the lithography process, the actual lithography-simulated layout will match the desired layout. The pre-distorted layout is then provided as input to lithography simulators such as SOLID-C™ from SIGMA-C, Silicon Versus Layout (SiVL®) from Synopsys, and Calibre Optical and Process Rule Checking (ORC™) from Mentor Graphics. The lithography simulator also takes process and lithography models and parameters, empirical calibrations, thresholds for printability and pre-distorted layout as inputs. The output of the lithography simulator is a prediction of the printed layout, that is, the lithography-simulated layout, of the elements. In other words, the lithography simulator generates a lithography-simulated layout for the elements. For the sake of convenience, this will be referred to as the lithography-simulated layout. The lithography-simulated layout comprises one or more lithography-simulated shapes, where each lithography-simulated shape corresponds to an element in the integrated circuit. The accuracy and complexity of the simulation can vary, for example, with respect to the degree to which effects due to optical resist and etching processes are considered.

The lithography-simulated layout is a prediction of the actual printed layout. Unfortunately, the lithography-simulated layouts are usually far more complex than the drawn layouts. For example, the drawn layouts are typically constrained and are purely rectilinear, i.e., with an axis-parallel, or at worst, octilinear, i.e., with an axis-parallel and edges at 45-degrees. However, the lithography-simulated layouts may contain arbitrary angles. Further, while a drawn layout may have relatively few vertices, its corresponding lithography-simulated layout may have many more vertices and may even be curved. These differences between the drawn layouts and lithography-simulated layouts imply that performance analyses, based on the drawn layouts, may not accurately predict the performance of the lithography-simulated shapes. Direct performance analyses of lithography-simulated shapes would alleviate the problem. However, almost all circuit analysis tools are restricted to a limited number of primitive shapes, such as rectilinear and octilinear shapes. Moreover, these circuit analysis tools cannot handle the arbitrary and complex shapes generated by lithography simulators efficiently.

Simple techniques can be used to approximate arbitrary-angled layouts by sets built up from primitive shapes, which are supported by a circuit analysis tool. For example, algorithms used for rasterization in computer graphics and in numerical analysis techniques will readily convert a slanted edge to a staircase of rectilinear edges. However, these techniques are usually not useful in this context because they create shapes with even more edges and vertices than the original shapes. For example, a single two-dimensional shape with a slanted edge may be converted to a large number of rectangular shapes. Further, the approximated shapes may or may not necessarily match the lithography-simulated shapes with respect to a given performance characteristic. For example, in the case of wires as elements, changing either the length or width of the wires results in a change in the timing delay as a performance characteristic.

The performance analysis performed by the circuit analysis tool depends on the geometric shape of the drawn layout of the elements. For example, the overlap capacitance of a conductor to a ground plane above or below depends on its surface area. This area depends on the shape of the top and bottom surfaces of the conductor, for example, the resistance of a conductor depends on the area of its cross section. The drive current of a transistor device is a function of the ratio of the device channel width to the device channel length. The drive current determines the delay characteristics of the device. The leakage current of a device has roughly an exponential dependence on the device channel length, but is linearly proportional to the device channel width. For example, the critical area for open faults depends on the width of an element, while the critical area for short faults depends on the spacing between two adjacent elements.

In order to overcome the discrepancy mentioned above, various embodiments of the present invention determine an equivalent circuit representation of the lithography-simulated layout. The equivalent circuit representation can be an equivalent layout, an equivalent circuit netlist, or a parasitic netlist for metal interconnect, vias and contacts. The selection of any one of the above-mentioned equivalent circuit representations is based on the type of circuit analysis tool, which analyzes the selected equivalent circuit representation. In one embodiment of the present invention, the user selects the type of circuit analysis tool, whereby the corresponding equivalent circuit representation is determined. For example, consider that a user wishes to determine an equivalent layout. In such a case, the equivalent layout determined is equivalent to the lithography-simulated layout in terms of certain performance characteristics, so that the equivalent layout and the lithography-simulated layout exhibit similar behavior. The equivalent layout is in a form that is suitable for being used by the circuit analysis tool, which analyzes the specific performance characteristic. For example, the equivalent layout may be built up from primitive shapes supported by the circuit analysis tool. Therefore, the circuit analysis tool can access the equivalent layout and analyze the performance characteristic, which is an approximation of the performance characteristic of the lithography-simulated layout. Further, the equivalent layout is preferably less complex than the lithography-simulated layout, that is, it has fewer vertices than the lithography-simulated layout. This reduces the time required for the circuit analysis tool to analyze the layout. Consider, for example, that the element being analyzed is the gate of a transistor, and the performance characteristic being analyzed is timing delay. Further, consider that the circuit analysis tool can only handle rectangular gates, and that the lithography-simulated layout of the gate is a curved shape. Various embodiments of the present invention determine a rectangular-shaped gate that has approximately the same timing delay as the lithography-simulated layout. The circuit analysis tool can then analyze the equivalent, rectangular gate for the timing delay.

Consider another case where the circuit analysis tool analyzes the equivalent circuit netlist or the parasitic netlist. Hence, an equivalent circuit netlist is determined. The netlist is a division of the integrated circuit, formed by grouping a plurality of elements into one net. For example, if the circuit analysis tool is a SPICE-based tool, then the equivalent circuit netlist is a SPICE-based netlist containing design representations at the transistor level. A parasitic netlist may also be provided in a Standard Parasitic Exchange Format (SPEF), which lists all the extracted resistors, capacitors and inductors in a net-by-net fashion. A circuit netlist is a topology of design representations of the integrated circuit. These design representations can either be representations at a gate level or at a transistor level. If the design representation is a gate level representation, then the equivalent circuit netlist will be a representation of equivalent gates and interconnections in the integrated circuit, based on one or more performance characteristics. Examples of such a netlist include Verilog and VHDL representations. For example, consider a case where the performance characteristic is timing, i.e., delay. Then the equivalent circuit netlist will contain design representations of the gates with equivalent timing.

FIG. 1 is a flow diagram illustrating a method for designing an integrated circuit, in accordance with an embodiment of the present invention. The integrated circuit includes a plurality of elements. Examples of the elements include but are not limited to devices, wires, contacts, vias, gates, and so forth. At step 102, a lithography-simulated layout corresponding to at least one element of the plurality of elements is obtained. The lithography-simulated layout accounts for the lithography effects on the elements. In other words, the lithography-simulated layout is the printed shape predicted after lithography. At step 104, an equivalent circuit representation corresponding to the lithography-simulated layout, with respect to one or more performance characteristics, and selected according to user preferences, is determined. The equivalent circuit representation is in a form that is suitable for the use by a circuit analysis tool. The equivalent circuit representation can be an equivalent layout, an equivalent circuit netlist, or a parasitic netlist. The selection of any one of the equivalent circuit representations mentioned above is based on the type of circuit analysis tool used, which is chosen by the user. In one embodiment of the present invention, the equivalent circuit representation is the equivalent layout. The equivalent layout accounts for electrical variations due to lithography effects on the elements. In other words, the equivalent layout reflects the electrical impact of lithography on the elements. The determination of the equivalent circuit representation is explained further in conjunction with FIG. 3.

The equivalent circuit representation includes a representation of a physical layout of at least one element and/or a netlist of the integrated circuit. The equivalent circuit representation can also include performance, timing and parasitic information pertaining to the integrated circuit. At step 106, the equivalent circuit representation is provided to the circuit analysis tool. The circuit analysis tool analyzes the performance characteristic of the at least one element. The performance characteristic depends on the element under consideration. For example, when the element is a wire, the performance characteristic comprises at least one characteristic from the calculation of resistance and the calculation of capacitance. In case when the equivalent circuit representation is the equivalent layout, then the equivalent layout of the wire has a resistance and/or capacitance that is equivalent to that of the lithography-simulated layout of the wire. Similarly, when the element is a contact or via, the equivalent layout is determined with respect to the performance characteristic as resistance, that is, the equivalent layout has a resistance equivalent to that of the lithography-simulated layout. Moreover, when the element is a device, the performance characteristic may be one or more of the following: leakage power, timing delays (rise and/or fall switching time) or propagation delays, capacitance and resistance. Depending on the analysis desired, the equivalence of the equivalent layouts can be based on other performance characteristics, including but not limited to, various power metrics, timing delays, setup time and hold time, parasitic extraction, noise performance, reliability and signal integrity.

Figure 2:
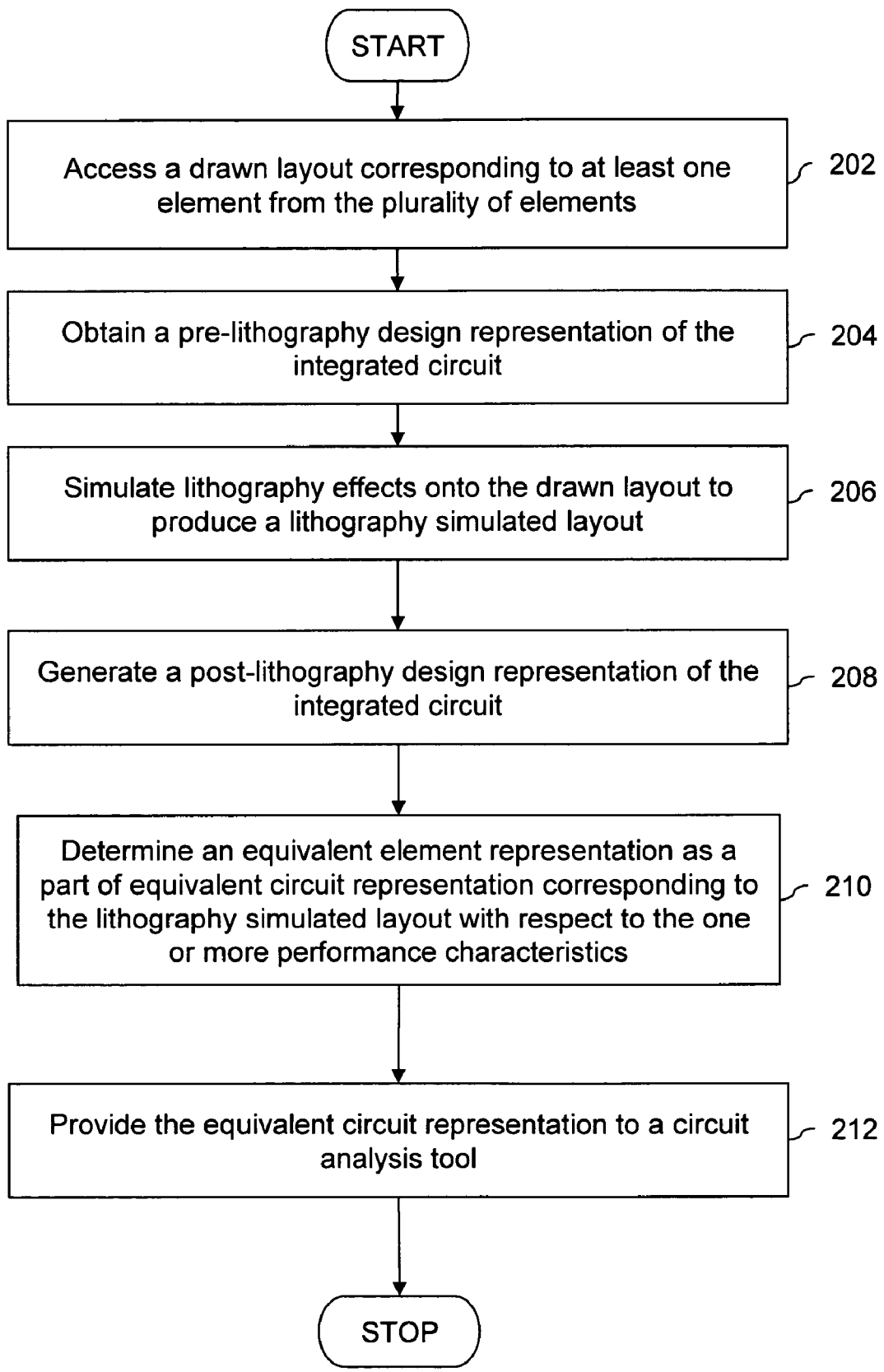
FIG. 2 is a flowchart of a method for designing an integrated circuit, in accordance with another embodiment of the present invention.

FIG. 2 is a flow diagram illustrating a method for designing an integrated circuit, in accordance with another embodiment of the present invention. At step 202, a drawn layout corresponding to at least one element is accessed. In other words, a layout, which needs to be printed on a wafer, is obtained. At step 204, a pre-lithography design representation of the integrated circuit is obtained. The pre-lithography design representation includes a netlist representation of the drawn layout accessed at step 202. At step 206, lithography effects are simulated onto the drawn layout, to produce a lithography-simulated layout. Therefore, the lithography-simulated layout is obtained at step 206. At step 208, a post-lithography design representation of the integrated circuit is generated. The post-lithography design representation comprises a netlist representation of the lithography-simulated layout. In one embodiment of the present invention, the post-lithography design representation is generated according to steps 202 and 208. In another embodiment of the present invention, the lithography-simulated layout can be obtained from a pre-specified database that stores the lithography-simulated layout of the plurality of elements. The lithography-simulated layout comprises one or more lithography-simulated shapes, each of which corresponds to an element in the integrated circuit.

At step 210, an equivalent element representation of each of the plurality of elements is obtained. This equivalent element representation is either an equivalent shape or a parametric equivalence. The parametric equivalence is in the form of an equivalent circuit netlist or an equivalent parasitic netlist. The selection of any of the two classifications of the equivalent element representations is based on the type of circuit analysis tool. The user selects the type of the circuit analysis tool to be used. The equivalent element representations are combined to form an equivalent circuit representation corresponding to the lithography-simulated layout with respect to one or more performance characteristics. For example, if the user wants to obtain an equivalent layout corresponding to the lithography-simulated layout, then the equivalent shape corresponding to the lithography-simulated shape is determined at step 210. Equivalent shapes for different lithography-simulated shapes are combined to form an equivalent layout as a part of the equivalent circuit representation. In another case, if the user wants to obtain the equivalence of the lithography-simulated layout in the form of a netlist, then the parametric equivalence corresponding to the lithography-simulated layout is determined at step 210. At step 212, the equivalent circuit representation is provided to the circuit analysis tool, which analyzes the performance characteristic of at least one element. The equivalent circuit representation is stored in a format supported by the circuit analysis tool. In one embodiment of the present invention, the drawn layout is replaced with the equivalent circuit representation and is made accessible to the circuit analysis tool.

Figure 3:
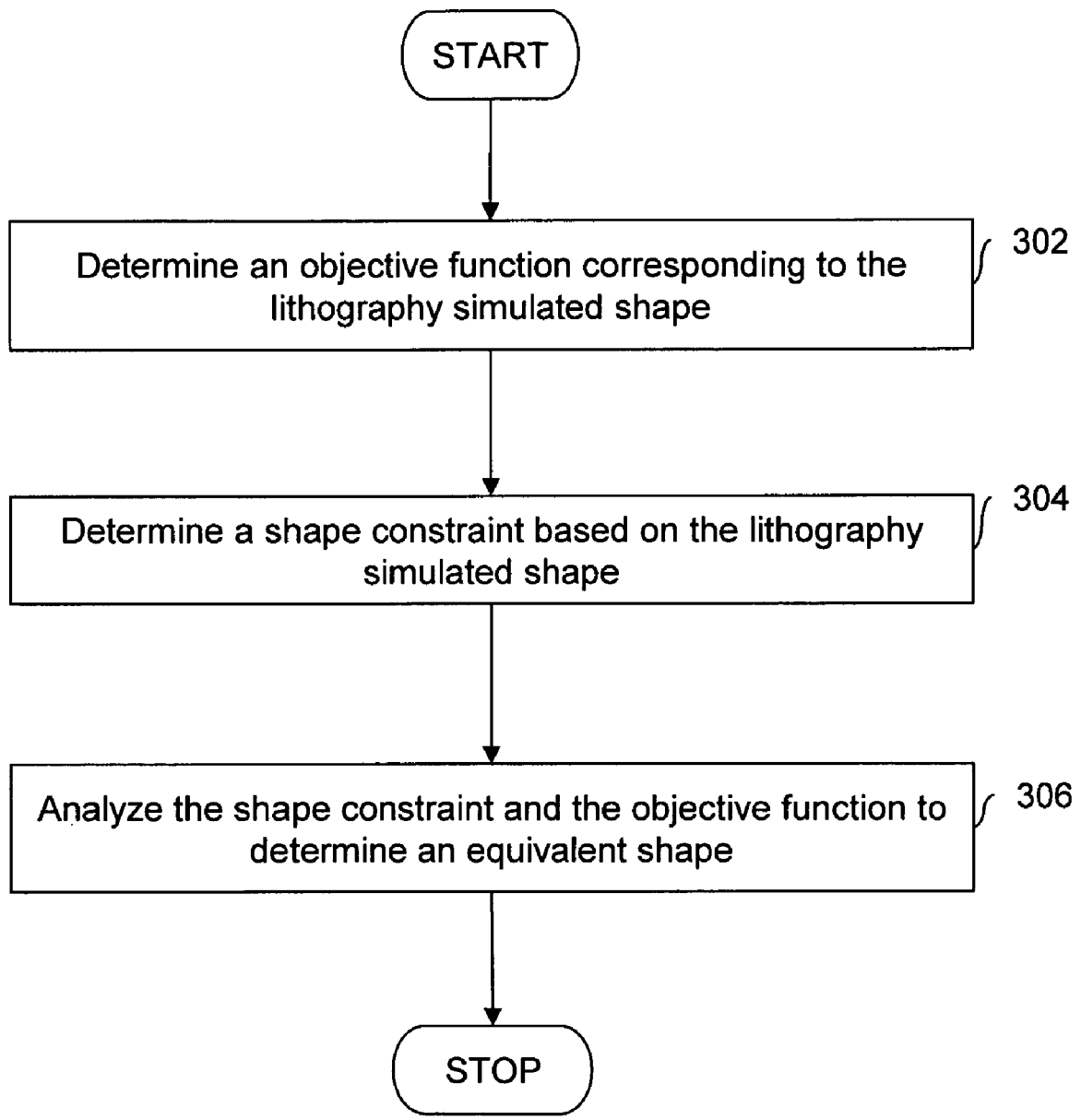
FIG. 3 is a flowchart of a method for determining an equivalent circuit representation, in accordance with an embodiment of the present invention.

FIG. 3 is a flowchart of a method for determining an equivalent circuit representation, in accordance with another embodiment of the present invention. In this embodiment, the equivalent circuit representation is determined as an equivalent shape corresponding to a lithography-simulated shape. At step 302, an objective function is determined corresponding to a lithography-simulated shape, based on the performance characteristic associated with the lithography-simulated shape. For example, consider a case, where the lithography-simulated shape is a device such as a transistor, and the performance characteristic under consideration is the delay of the transistor, which is characterized by the drive current of the transistor. The drive current of the transistor is dependent on the channel width and the channel length. The channel width and the channel length are hereinafter referred to as width and length respectively. Specifically, the drive current, i.e., the delay, can be taken to be a function of the ratio of the width to the length. An exemplary objective function for this case can be taken as:

$$f(w, l) = a * \frac{w}{l} \quad (1)$$

Where a is a proportionality constant;
w is the width of the device; and
l is the length of the device.

At step 304, a shape constraint, based on the lithography-simulated shape, is determined. The shape constraint is a limitation on either the width or the length, or both, of the lithography-simulated shape. For example, consider a case where the lithography-simulated shape is a union of two rectangular shapes, one with dimensions represented as width $W_1$ and length $L_1$, while the other has dimensions represented as width $W_2$ and length $L_2$. In one case, the shape constraint is limited by the length of the lithography-simulated shape as:

$$W = W_1 + W_2 \quad (2)$$

where W is the equivalent width of the equivalent shape corresponding to the lithography-simulated shape.

Alternatively, the shape can be limited by the length of the lithography-simulated shape as:

$$L = L_1 + L_2 \quad (3)$$

where L is the equivalent length of the equivalent shape corresponding to the lithography-simulated shape.

When the performance characteristic under consideration is delay, the drive current (that causes the delay) of the lithography-simulated shape is a sum of the drive currents of two rectangles (union of which make the lithography-simulated shape). Since the drive current is dependent on the width of the device, the shape constraint is limited by the width of the lithography-simulated shape, as given in the equation (2).

At step 306, the objective function and the shape constraint are analyzed to determine the equivalent shape corresponding to the lithography-simulated shape. The analysis can be performed by finding Weq and, Leq so that the following equation is satisfied:

$$f(Weq, Leq) = \int_0^{L1+L2} f(w,l) dw \quad (4)$$

Now, the equivalent shape will have the following dimensions:

$$Weq = W \quad (5)$$

$$Leq = \frac{Weq}{X} \quad (6)$$

$$\text{where } X = \int_0^W \frac{dw}{l} \quad (7)$$

On simplifying and putting equation (1) into equation (4), the values of Weq and Leq are determined as the following:

$$Weq = W_1 + W_2 \quad (8)$$

$$Leq = \frac{(W_1 + W_2)*(L_1 + L_2)}{(W_1 * L_2) + (W_2 * L_1)} \quad (9)$$

The Weq, as given by equation (8), and, Leq as given by equation (9), represent dimensions of a rectangle, which are equivalent to the two rectangles that are merged to form the lithography-simulated shape. The equivalence of the rectangles is in terms of the delay.

Consider another case where the lithography-simulated shape is a device such as a transistor, and the performance characteristic under consideration is the leakage current of the transistor. The leakage current of a device is roughly exponentially dependent on the length but is linearly proportional to the width. An exemplary objective function of this case can be taken as the following:

$$f(w,l) = w * e^{(a*l)} \quad (10)$$

where a is a proportionality constant;
w is the width of the device; and
l is the length of the device.

When the performance characteristic under consideration is the leakage current of the lithography-simulated shape, the net leakage current can be taken as the sum of the leakage currents of two rectangles, which are merged to form the lithography-simulated shape. The variation in the width of the device imposes a constraint on the leakage current. Therefore, the shape constraint is limited by the width of the lithography-simulated shape, as given in the equation (2).

The objective function and the shape constraint are analyzed to determine the equivalent shape corresponding to the lithography-simulated shape. On simplifying and putting equation (10) into equation (4), the values of the Weq and the Leq are determined as the following:

$$Weq = W_1 + W_2 \quad (11)$$

$$Leq = \frac{W_1 + W_2}{a * \left[ \begin{array}{l} \log(W_1 * e^{(a*L_1)} + W_2 * \\ e^{(a*L_2)}) - \log(W_1 + W_2) \end{array} \right]} \quad (12)$$

The Weq, as given by equation (11), and the, Leq as given by equation (12) represent the dimensions of a rectangle that is equivalent to the two rectangles merged to form the lithography-simulated shape. The equivalence of the rectangles is in terms of the leakage current.

In another example, the lithography-simulated shape is a device such as a wire, and the performance characteristic under consideration is the resistance of the wire. The resistance of the wire is inversely proportional to the area of its cross section. The area of cross section depends on the width of the cross section. An exemplary objective function for this case can be taken as:

$$f(w,l) = a * l/w \quad (13)$$

where a is a proportionality constant;
w is the width of the wire; and
l is the length of the wire.

In the case of a wire, its total length is a constraint imposed on it due to its connectivity depending on its length. Hence, the shape constraint is limited by the length of the lithography-simulated shape, as illustrated in the equation (3).

The objective function and the shape constraint are analyzed to determine the equivalent shape corresponding to the lithography-simulated shape. On simplifying and putting equation (13) into equation (4), we determine the values of the Weq and the Leq as:

$$Leq = L_1 + L_2 \quad (14)$$

$$Weq = \frac{(W_1 * L_1) + (W_2 * L_2)}{L_1 + L_2} \quad (15)$$

The values of the Weq, as illustrated by equation (14), and the Leq, as illustrated by equation (15), represent dimensions of a rectangle, which are equivalent to the two rectangles that are merged to form the lithography-simulated shape. The equivalence of the rectangles is in terms of the leakage current.

While the method described above explains the method for determining an equivalent shape corresponding to the lithography-simulated shape, in another embodiment of the present invention, an effective length ($L_{eff}$) of the entire lithography-simulated layout is calculated. A function $f(\ )$ that preserves the equivalence of the performance characteristic under consideration is defined. Then, the value of $f(W,L)$ is calculated for each slice and these values are added. $L_{eff}$ is the value of L, which, in combination with $W_{eff}$, gives the same total function value. Mathematically, $$f(W_{eff}, L_{eff}) = \Sigma f(W, L) \quad (16)$$

The function $f(\ )$ is different for different performance characteristics. Examples of the function $f(\ )$ include the objective functions represented by the equations described in conjunction with FIG. 3 (i.e., equations (1), (10), and (13)).

Figure 4:
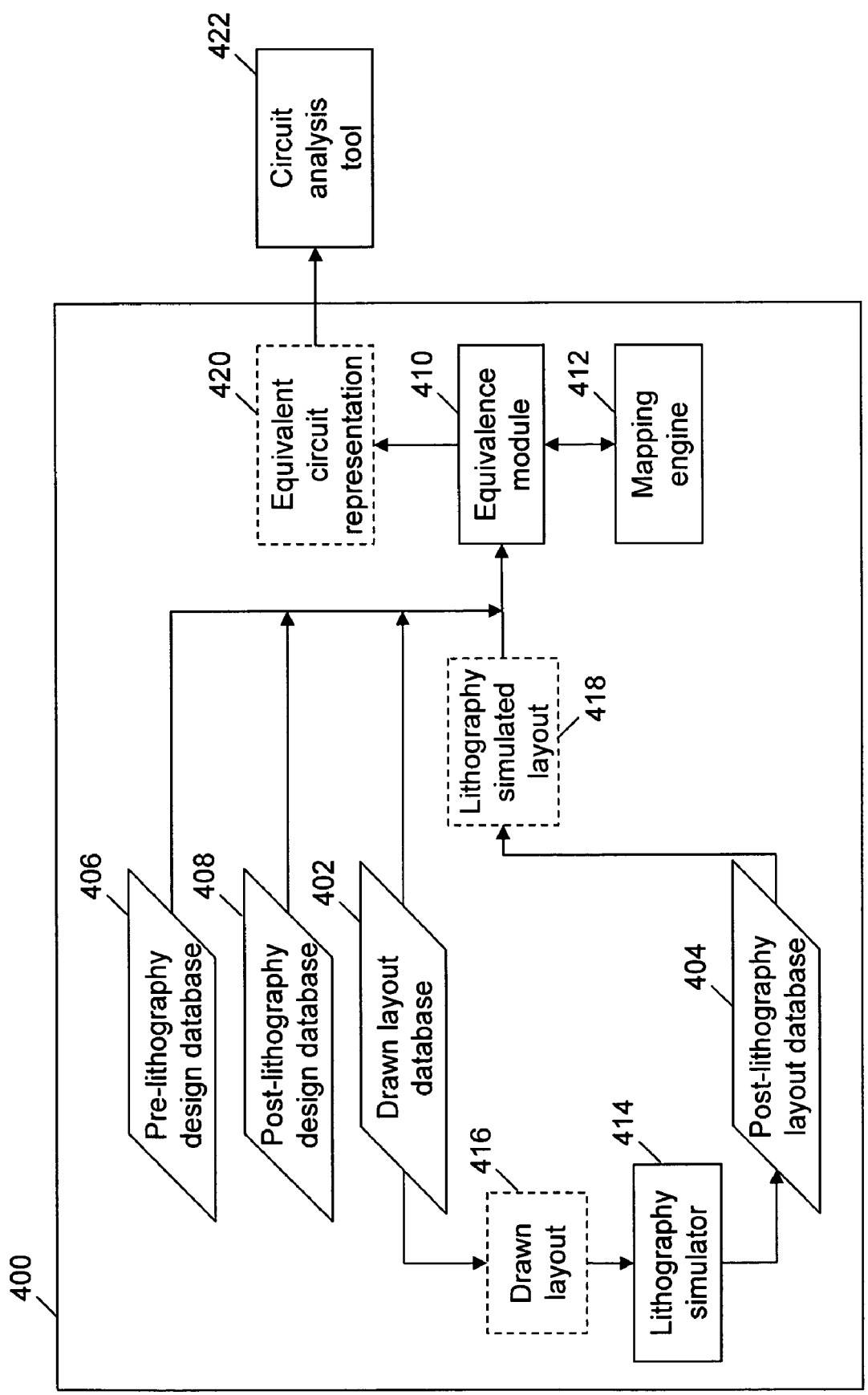
FIG. 4 is a block diagram of a system for designing an integrated circuit, in accordance with an embodiment of the present invention.

FIG. 4 is a block diagram of a system 400 for designing an integrated circuit, in accordance with an embodiment of the present invention. The system 400 includes a drawn layout database 402, a post-lithography layout database 404, a pre-lithography design database 406, a post-lithography design database 408, an equivalence module 410, a mapping engine 412, and a lithography simulator 414. In FIG. 4, dashed boxes represent inputs or outputs of the system components, while the parallelogram boxes represent different types of databases. Drawn layout database 402 includes a drawn layout 416, while post-lithography layout database 404 includes a lithography-simulated layout 418. In an exemplary embodiment of the present invention, post-lithography design database 408 stores lithography-simulated layout 418 in a simGDSII format. In another embodiment of the present invention, the post-lithography design database is created after lithography simulation on the pre-lithography design database. For example, a lithography simulator similar to lithography simulator 414 simulates lithography effects on pre-lithography design database 406 and stores the resulting netlist in post-lithography design database 408. Examples of lithography simulator 414 include SOLID-C™ from SIGMA-C (SiVL®), Silicon Versus Layout from Synopsys, Calibre Optical and Process Rule-Checking (ORC™) from Mentor Graphics, and so forth. An exemplary format for drawn layout 416 is LEF/DEF.

Mapping engine 412 determines at least one equivalent element representation of lithography-simulated layout 418, corresponding to at least one element with respect to one or more performance characteristics. Equivalence module 410 determines an equivalent circuit representation 420 corresponding to lithography-simulated layout 418, based on user preferences, and the at least one equivalent element representation, and a circuit analysis tool 422. The equivalent circuit representation can be in the form of an equivalent circuit netlist, an equivalent parasitic netlist, or an equivalent layout. Equivalence module 410 obtains either parametric equivalence or an equivalent shape corresponding to the lithography-simulated layout from mapping engine 412. Depending on the user selection, in one case, equivalence module 410 uses the parametric equivalence to generate the equivalent circuit netlist or an equivalent parasitic netlist. In another case, equivalence module 410 uses the equivalent shapes corresponding to the lithography-simulated shapes, to generate an equivalent layout. The output of equivalence module 410, i.e., equivalent circuit representation 420, is provided to circuit analysis tool 422, which analyzes the performance characteristics of the integrated circuit. Examples of circuit analysis tool 422 include, but are not limited to, Prime Time, Prime Time SI (Signal Integrity), and Prime Power from Synopsys. The Prime Time tool statically analyzes the timing of the integrated circuit, and Prime Time SI analyzes the crosstalk induced delay and noise variations in the integrated circuit. The Prime Power tool performs power analysis of the integrated circuit. The analysis result can be reported on an element-by-element or a cell-by-cell basis.

In another embodiment of the present invention, the user selects parametric equivalence as the equivalent element representation. The parametric equivalence is then represented in the form of a circuit netlist or a parasitic netlist. In this embodiment, equivalence module 410 calls mapping engine 412 to obtain the parametric equivalence corresponding to lithography-simulated layout 418. The equivalence module 410 generates equivalent circuit representation 420 in the form of the circuit netlist or the parasitic netlist, based on the parametric equivalence obtained from mapping engine 412. Further, equivalence module 410 can replace equivalent circuit representation 420 in post-lithography design database 408. Post-lithography design database 408 is then analyzed by circuit analysis tool 422. Mapping module 412 is explained below in conjunction with FIG. 6.

Figure 5:
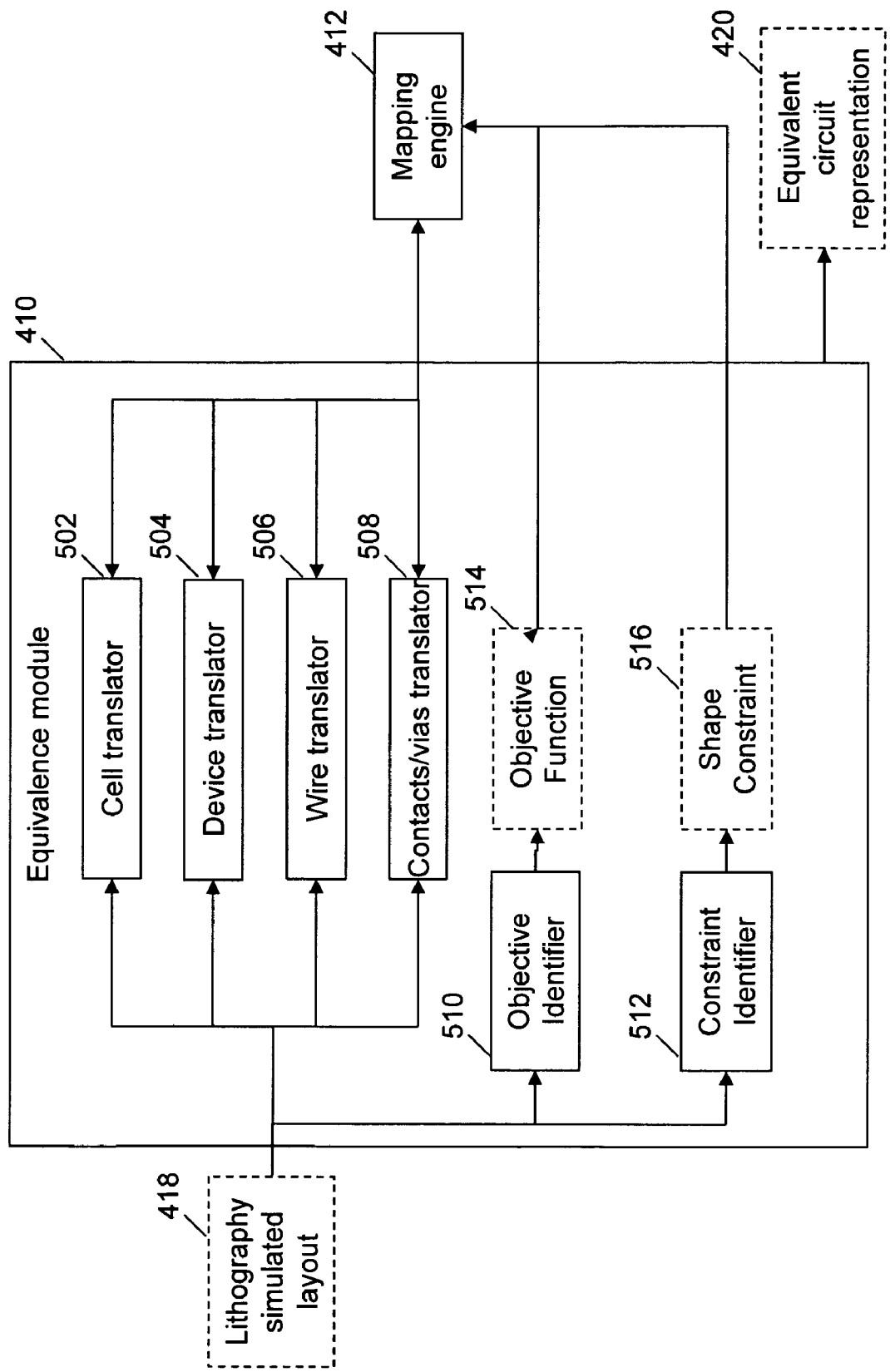
FIG. 5 is a block diagram of an equivalence module, in accordance with an embodiment of the present invention.

FIG. 5 is a block diagram of equivalence module 410, in accordance with an embodiment of the present invention. Equivalence module 410 includes a cell translator 502, a device translator 504, a wire translator 506, and a contacts/vias translator 508. One or more of these translators receive one or more parametric equivalence corresponding to lithography-simulated layout 418 from mapping module 412. In one embodiment of the present invention, the user selects the equivalent layout as one of the equivalent element representations. In such a case, depending on the element, cell translator 502, device translator 504, wire translator 506, or contacts/vias translator 508 call mapping engine 412 to obtain the equivalent shape corresponding to a lithography-simulated shape of the element. The equivalent shapes obtained, for one or more elements, are combined to form an equivalent layout, which can then be replaced in post-lithography layout database 404 by equivalence module 410. The replaced post-lithography layout database 404 is then analyzed by circuit analysis tool 422. For example, the cell translator 502 determines an equivalent layout of a cell with one or more equivalent cell lengths ($L_{cell(s)}$) as the lithography-simulated layout 418 of the cell. Device translator 504 determines the equivalent layout of a device with an equivalent device width and length as the lithography-simulated layout 418 of the device. The equivalent layout has an equivalent performance characteristic as lithography-simulated layout 418 of the device. Similarly, contacts/vias translator 508 determines the equivalent layout of the contacts/vias, with an equivalent resistance as the lithography-simulated layout 418 of the contacts/vias. The equivalent layout has a resistance that is equivalent to the resistance of lithography-simulated layout 418 of the contact or the via. The equivalent layout is in a form that is comprehensible to circuit analysis tool 422. The format for equivalent layout may be referred to as GDSII. This format is comprehensible for circuit analysis tools 422. The equivalent layout generated from one or all of the translators are provided to circuit analysis tools 422 for analysis.

In another embodiment of the present invention, wire translator 506 determines the equivalent layout of a wire with resistance and capacitance equivalent to that of lithography-simulated layout 418 of the wire. The equivalent layout has a resistance and/or capacitance that is equivalent to that of lithography-simulated layout 418 of the wire. The equivalent layout is a group of polygons that are electrically equivalent to the wires, and improve the accuracy of the extraction of wire parasitics, as compared to that obtained by simple geometric smoothing of lithography-simulated layout 418. Further details of the procedure are described in U.S. patent application Ser. No. 11/199,900, titled "Method and System for Reshaping Metal Wires in a VLSI Design", filed on Aug. 8, 2005, assigned to Blaze-DFM Inc., which is hereby incorporated by reference in its entirety.

In another embodiment of the present invention, the user selects an equivalent circuit netlist as the equivalence element representation. Equivalence module 410 calls mapping engine 412 to obtain parametric equivalence of the corresponding lithography-simulated layout. This parametric equivalence is used to generate the equivalent circuit representation 420 of the lithography-simulated layout. The equivalent circuit representation 420 is either in the form of the circuit netlist or the parasitic netlist, depending on the circuit analysis tools 422 used. For example, if circuit analysis tool 422 is SPICE-based tool, then a circuit netlist, depicting the connections of the various transistors in the integrated circuit, is generated. In another case, a parasitic netlist depicting the interconnection between various resistances, capacitances and inductances is generated if circuit analysis tool 422 is Star-RCXT™ from Synopsys or QuickCap™ from Magma or any other similar parasitics extraction tool.

Equivalence module 410 further includes an objective identifier 510 and a constraint identifier 512. Objective identifier 510 determines an objective function 514 corresponding to lithography-simulated layout 418 of an element based on the performance characteristic. Constraint identifier 512 determines a shape constraint 516 corresponding to an element in the integrated circuit. Shape constraint 516 is determined on the basis of lithography-simulated layout 418. Objective function 514 and shape constraint 516 are analyzed, as described in conjunction with FIG. 3, to obtain the equivalent shape corresponding to a lithography-simulated shape. The different equivalent shapes corresponding to the lithography-simulated layout are combined to form an equivalent layout, which is provided to circuit analysis tool 422. In all the embodiments described above, mapping module 412 sends either the parametric equivalence or the equivalent shapes to one or more of cell translator 502, device translator 504, wire translator 506, or contacts/vias translator 508, depending on the type of element under consideration and on the user preferences.

Figure 6:
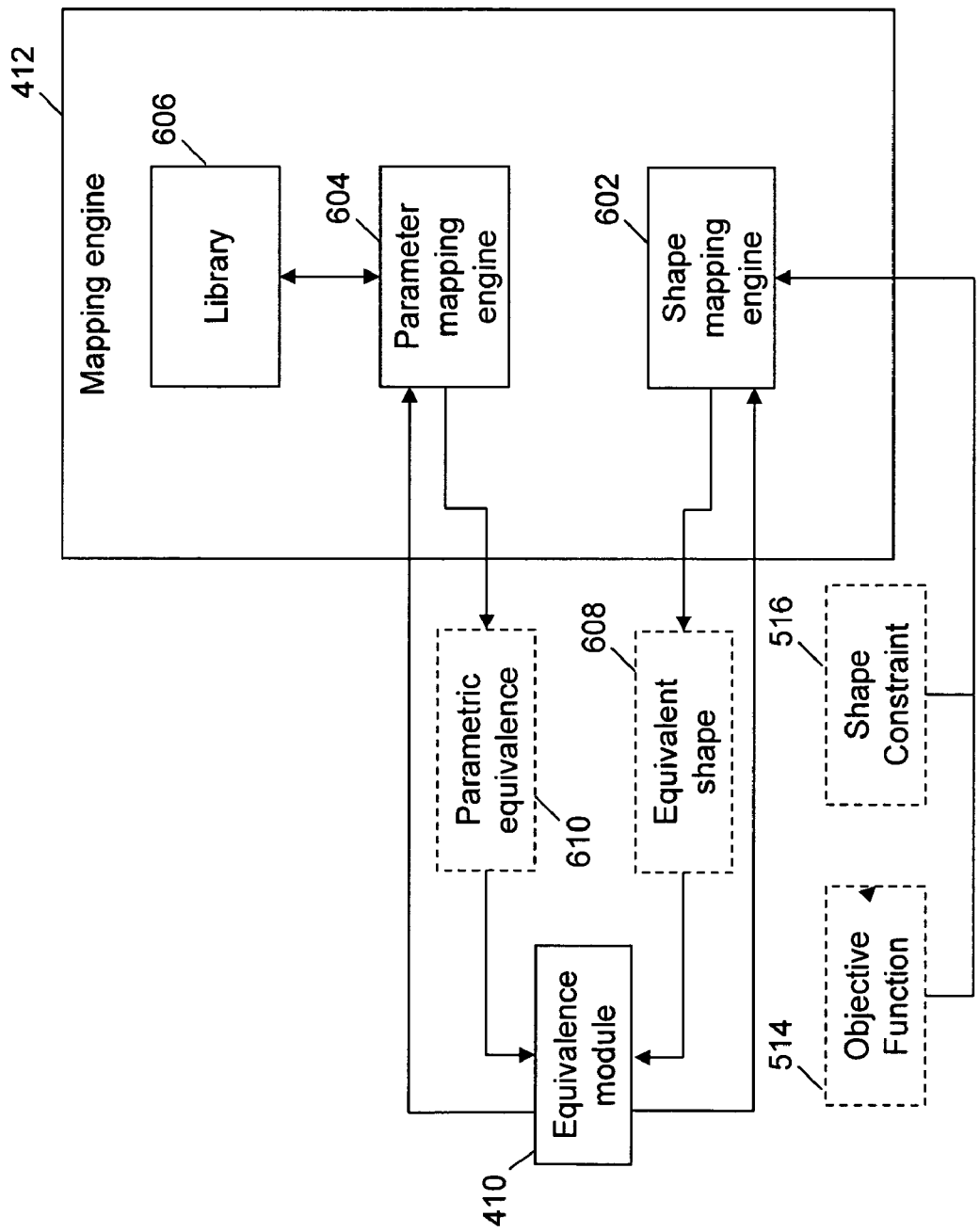
FIG. 6 is a block diagram of a mapping engine, in accordance with an embodiment of the present invention.

FIG. 6 is a block diagram of mapping engine 412, in accordance with an embodiment of the present invention. Mapping engine 412 includes a shape-mapping engine 602, a parameter-mapping engine 604, and a library 606. Shape-mapping engine 602 determines an equivalent shape 608 corresponding to the lithography-simulated shape of an element, which is received from equivalence module 410. Equivalent shape 608 is determined with respect to one or more performance characteristics, which are chosen, based on user preferences. An equivalent shape 608, for each element in a layout, is provided to equivalence module 410, which combines all the equivalent shapes to form an equivalent layout as equivalent circuit representation 420 corresponding to lithography-simulated layout 418. In case the element is a wire, then wire translator 506 in equivalence module 410 sends a lithography-simulated shape of the wire to shape-mapping engine 602, which determines an equivalent shape of the wire that has either an equivalent resistance and/or an equivalent capacitance as the lithography-simulated shape. In the case of a contact or a via, the equivalent shape for the contact or the via has an equivalent resistance as the lithography-simulated shape for the contact or the via in lithography-simulated layout 418. Various methods of generating equivalent layouts by shape-mapping engine 602 are described in conjunction with FIGS. 8, 9 and 10.

In another embodiment of the present invention, parameter-mapping engine 604 provides a parametric equivalence 610, corresponding to elements in lithography-simulated layout 418, to equivalence module 410. Equivalence module 410 sends lithography-simulated shapes to parameter-mapping engine 604. Equivalence module 410 uses parametric equivalence 610 to generate either the circuit netlist, or the parasitic netlist, depending on the user preferences. In order to achieve the above-mentioned objective, parameter-mapping engine 410 selects a design representation from library 606, based on lithography-simulated layout 418. Library 606 includes one or more pre-defined design element representations of the plurality of elements. Each of the pre-defined element representations in library 606 is associated with performance information about the integrated circuit. Examples of formats of representations in the library include Verilog, GDSII, SPICE and LEF. The library may also provide the performance characteristics of alternative design representations. Such performance models can exist in various formats, such as Synopsys Liberty and Cadence TLF. It will be apparent to those skilled in the art that the parametric equivalence can also be determined with the help of a function (inbuilt in a software program) that is present in parameter mapping engine 604. The function returns the values of different equivalent parameters corresponding to different elements.

For example, consider a case when the plurality of elements forms a cell. In such a case, parametric equivalence 610, returned by parameter-mapping engine 604 for the cell, may be one or more effective cell lengths as lithography-simulated layout 418 of the cell. Each of the one or more effective cell lengths corresponds to one element in the cell. Similarly, when the plurality of elements form a device, parametric equivalence 610 for the device is an effective device width and length as lithography-simulated layout 418 of the device. In another case, when the plurality of elements comprises a wire, the parametric equivalence 610 of the wire has either an equivalent resistance or an equivalent capacitance as the lithography-simulated layout 418 of the wire. In yet another example, when the plurality of elements is either a contact or a via, the parametric equivalence 610 of the contact or the via is an equivalent resistance as lithography-simulated layout 418 of the contact or the via.

Figure 7:
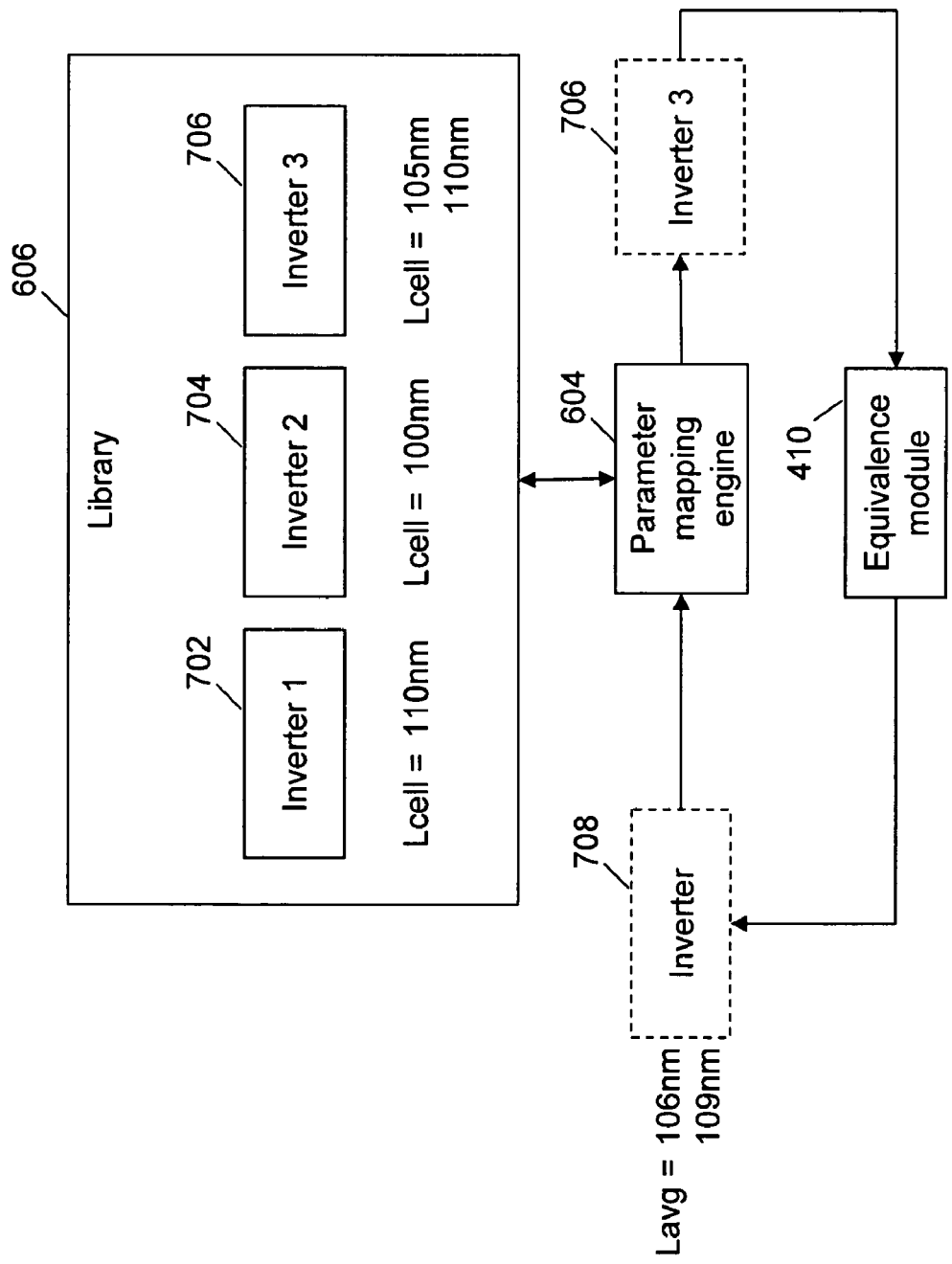
FIG. 7 is a block diagram illustrating the selection of a design representation from a library, in accordance with an embodiment of the present invention.

FIG. 7 is a block diagram illustrating the selection of design representation from the library, in accordance with an embodiment of present invention. In this example, library 606 is shown to include three design representations of inverters: inverter 702, inverter 704, and inverter 706. Parameter-mapping engine 604 receives a design representation 708 of an inverter (corresponding to the lithography simulation layout 418 of the inverter) from equivalence module 410. The inverter comprises a combination of two transistors forming a cell. The design representation of inverter 702 has an effective equivalent cell length of 110 nm ($L_{cell}$) for both transistors. Similarly, the design representation of inverter 704 has an effective equivalent cell length of 100 nm ($L_{cell}$) for both transistors, and the design representation of inverter 706 has two effective equivalent cell lengths as 105 nm and 110 nm, respectively, for each of the transistors. Consider a case when the design representation 708 of the inverter has two different average cell lengths ($L_{avg}$) for the two transistors, as 106 nm and 109 nm. The parameter-mapping engine 604 selects the design representation 706 (inverter 3) as an equivalent of the design representation 708, as the closest approximate values of the equivalent cell length ($L_{cell}$). The selected design representation 706 is then given back to equivalence module 410, which then generates the circuit netlist or the parasitic netlist, depending on the user preferences.

In another embodiment of the present invention, parameter-mapping engine 604 replaces a design representation for an element based on an interpolation of two or more design representations of elements stored in library 606. The interpolated design representation is replaced in post-lithography design database 408. For example, consider a case when each design representation of inverters present in the library 606 are not close to the design representation of the inverter 708. In such a case, an interpolated design representation between two inverters present in the library 606 (for example, inverter 702 and inverter 704 ) is generated and replaces the design representation of the inverter 708 in the post-lithography design database 408.

Performance analysis can be carried out on a per cell basis. In this case, every $L_{avg}$ of a cell in the post litho database is mapped to an equivalent $L_{cell}$ of a cell in library 606. For example, every design representation in library 606 has all the transistors in it with their corresponding gate lengths. Hence, every design representation is represented by one or more Lcell(s). In such a case, the equivalent length of each cell is calculated. The effective cell lengths also depend on the performance characteristic under consideration. For example, since the timing of a device depends directly on the length of the gate, hence for late-mode timing analysis, the corresponding functions for $L_{cell}$ of a given cell is:

$$L_{cell} = \max(L_i) \tag{17}$$

Similarly, as an example for early-mode timing analysis, $$L_{cell} = \min(L_i) \tag{18}$$

Further, since the leakage current in a device varies exponentially with the length of the device, an exemplary value of $L_{cell}$, for leakage analysis, can be taken as:

$$L_{cell} = \ln\left(\frac{\Sigma(W_i * e^{L_i})}{\Sigma W_i}\right) \quad (19)$$

where ln is log to the base e.

Similarly, since the capacitance is directly proportional to the area of the device, an exemplary value of $L_{cell}$, for capacitance calculation, can be taken as:

$$L_{cell} = \frac{\Sigma W_i * L_i}{\Sigma W_i} \quad (20)$$

Similarly, in the case of dynamic power, which is proportional to switched capacitance, the exemplary function of $L_{cell}$ becomes:

$$L_{cell} = \frac{\Sigma W_i * L_i}{\Sigma W_i} \quad (21)$$

In all of the above-mentioned examples $L_i$ and $W_i$ respectively, denote the effective length and width of device i in the cell.

Referring back to FIG. 6, the equivalent layouts (formed by combining equivalent shapes) generated by shape-mapping engine 602 are equivalent to the corresponding lithography-simulated layouts in terms of their performance characteristics. In order to generate equivalence, the elements are approximated by an effective width, an effective length, or both parameters of the element. For example, when the element is a gate, in order to generate an equivalent (or effective) layout of the gate corresponding to the lithography-simulated layout, either an equivalent width or an equivalent length, or both parameters of the gate, is determined.

FIGS. 8A, 8B and 8C are diagrams illustrating the calculation of the effective width of a gate, in accordance with an embodiment of the present invention. In a device such as a transistor, a gate is formed in a region where a poly-silicon layer overlaps a diffusion layer. In FIGS. 8A and 8B, drawn layout 802 of the diffusion region of a device is rectangular, but lithography-simulated layout 804 of the diffusion region may or may not be rectangular. As a result, the gate region of the device may not be well-defined. For example, the diffusion region is approximated by a rectangle 806, for the purpose of computing the effective gate width. As shown in FIG. 8B, the diffusion region contour is shrunk to within misalignment tolerance, represented by variations in 'a' and 'b' with respect to polysilicon layer 808. The values of a and b are changed, in order to generate rectangle 806. Accordingly in FIG. 8C, the non-rectilinear contour of the diffusion region is then approximated by rectangle 806, which has the same area. The width of the active region ($W_{eff}$), represented by rectangle 806, is used as an equivalent width of the gate. Moreover, mismatches in the area of the diffusion region, which are far away from the polysilicon gate, do not affect the width of the gate.

Figures 9A, 9B, 9C:
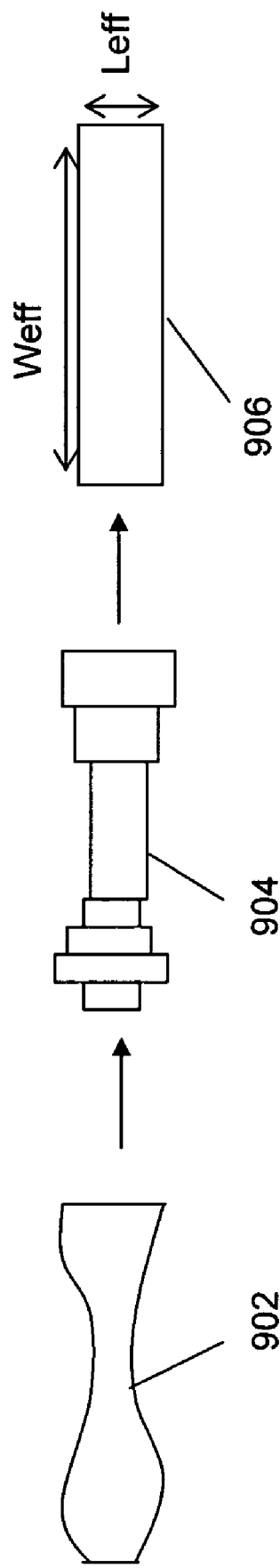
FIGS. 9A, 9B and 9C are diagrams illustrating the calculation of the effective length of a gate, in accordance with an embodiment of the present invention.

The equivalent layouts are further approximated by equivalent lengths, since performance characteristics such as dynamic power and delay are dependent on length variations in the gate. FIGS. 9A, 9B and 9C are diagrams illustrating the calculation of the effective length of a gate, in accordance with an embodiment of the present invention. A lithography-simulated layout 902 of the gate (as shown in FIG. 9A) is derived from the intersection of the lithography-simulated poly-silicon layer and the equivalent diffusion region, as determined in FIGS. 8A, 8B and 8C. Lithography-simulated layout 902 is altered to form a group of rectilinear shapes 904, with corresponding pairs of widths and lengths, as shown in FIG. 9B. Each rectilinear shape 904 is equivalent to a cross-sectional slice of lithography-simulated shape at a different point along the length. Following this, an effective length is computed from the pairs of widths and lengths. The effective length ($L_{eff}$), determined as shown in FIG. 9C, and the effective width $W_{eff}$, determined as shown in FIG. 8C, together define an effective rectangular gate 906 for the arbitrarily shaped lithography-simulated layout 902 of the gate. Both the rectilinearization and the computation of the effective $L_{eff}$ are based on determining a rectangle that has the same performance characteristic as the more complex shape it is replacing.

Figure 10D:
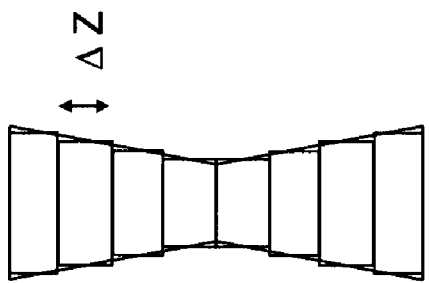
FIGS. 10A, 10B, 10C and 10D are diagrams illustrating the different approaches of rectilinearization, in accordance with various embodiment of the present invention.
Figure 10C:
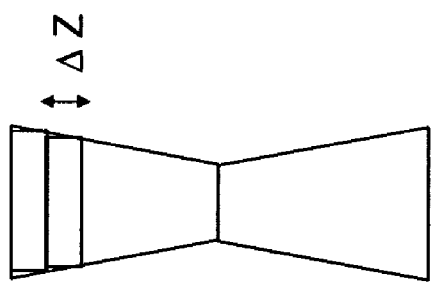
Figure 10B:
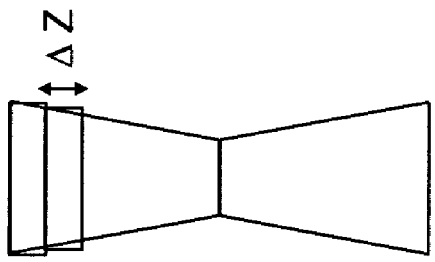
Figure 10A:
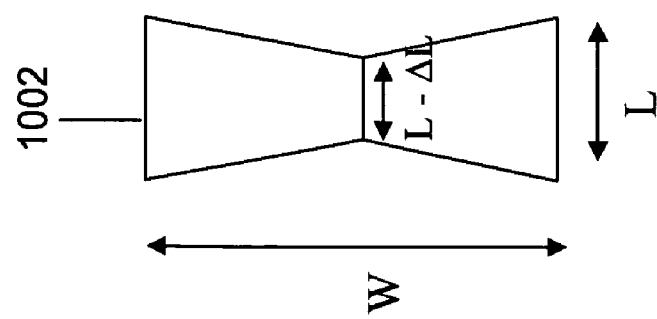

FIGS. 10A, 10B, 10C and 10D represent diagrams illustrating different approaches of rectilinearization (as performed in FIG. 9B), in accordance with an embodiment of the present invention. FIG. 10A is the lithography-simulated layout 1002 of the gate. Lithography-simulated layout 1002 is approximated by a set of trapezoids with the length L and width W. For the purpose of explanation, only two trapezoids have been shown. The problem then reduces to how to accurately approximate a trapezoid by a rectangle (or a set of rectangles). ΔL represents the difference in the length L of the gate at the midpoint of the width W of the gate. For example, if L=90 nm and ΔL=20 nm, then the minimum gate length along the gate width is 70 nm at the center of the gate. Three ways of "stair-stepping" a slanted edge are shown in FIGS. 10B, 10C and 10D. The width of each stair-step is represented by 'Δz'. The value of Δz=0 represents that no rectilinearization has been performed, and lithography-simulated layout 1002 is provided as an input to the circuit analysis tool. In FIG. 10B, the approximating rectangles are based on the outer vertices of the slanted edges, and therefore constitute an outer-sum approximation. In FIG. 10C, the approximating rectangles are based on the inner vertices of the slanted edges, and therefore constitute an inner-sum approximation. Similarly, in FIG. 10D, the approximating rectangles are based on the midpoints of the slanted edges, and therefore constitute a midpoint-sum approximation. The three approximations have significantly different results in terms of matching the performance characteristics of the delay and leakage currents. For example, outer-sum approximation underestimates the delays, while inner-sum approximation overestimates them. Midpoint-sum approximation retains accuracy even for a smaller number of rectangles (as governed by Δz). Midpoint-sum approximation preserves capacitance, delay and leakage current. Therefore, in a preferred embodiment of the present invention, midpoint-sum approximation is used as an approach of rectilinearization.

Further, these geometry-based approximations may result in direct equivalence of certain performance characteristics. For example, if the performance characteristic is capacitance, based on the area of the gate, then the mid-point sum approximation yields a rectangle with the same area as the trapezoid, and therefore also of the same capacitance. For more complex performance characteristics, the equivalent length of each rectangle can be determined, so as to preserve the equivalence of the trapezoid and the rectangle with respect to the performance characteristics. In an embodiment of the present invention, Bresenham's line drawing algorithm is used to stair-step an oblique edge. The step size $\Delta z$ is chosen to be the maximum step size, which preserves the area or minimum step size, within user-defined bounds, if preserving the area is not possible. Regardless of which approach is selected, the output of rectilinearization is pairs of W and L for each trapezoid.

After rectilinearization, the pairs of W and L are analyzed to determine an effective L for the entire gate. Different approaches can be used, preferably while maintaining equivalence with respect to the performance characteristic under consideration. One approach takes an averaging function F(W,L) as an input, which is a function of W and L. In accordance with an embodiment of the present invention, if the performance characteristic is delay, which is proportional to W/L, the averaging function can be taken as:

$$F = \frac{1}{W\left(\Sigma \frac{Wi}{Li}\right)} \quad (22)$$

Similarly, when the performance characteristic is capacitance, the averaging function can be taken as:

$$F = \frac{\text{Area}}{W} \quad (23)$$

where Area is the area of lithography-simulated layout 1002 of the gate. The averaging function is different for different device types and may also be based on empirical or simulation data.

In accordance with another embodiment of the present invention, a different approach is used for different types of devices. For example, in a low-Vt NMOS, i.e., a low threshold voltage N-type metal oxide semiconductor, simulations are run to obtain currents without any load on the device. The current at the OFF state corresponds to the leakage of the while current at the ON state, i.e. the saturation current corresponds to the delay. These current values are measured for a range of pairs of W and L and also at multiple $V_{gs}$ (voltage between gate and source) and $V_{ds}$ (voltage between drain and source) values. For each (W, L) pair, lookup tables are constructed by utilizing the following parameters:

I: current thorough the device (24)

$\Delta I/\Delta V_{ds}$: ratio of change in current to the change in $V_{ds}$ (25)

$\Delta I/\Delta V_{gs}$: ratio of change in current to the change in $V_{gs}$ (26)

A predetermined weighted function $$F'\left(I, \frac{\Delta I}{\Delta V_{ds}}, \frac{\Delta I}{\Delta V_{gs}}\right) \quad -(27)$$

can be used to look up a least squared error match to compute the effective L. More specifically, the average function can be taken as:

$$F(W,L) = LQSE(a_1, f_1, \ldots, a_i, f_i(W/L)) \quad (28).$$

where
LQSE is the least square error estimate.
$f_i(W, L)$ is the $i^{th}$ estimator function in the lookup tables.
$a_i$ is the weighting coefficient of the estimator function.

The granularity of width, for which the lookup table is constructed (20 nm in this case), is typically kept much smaller than required for the validity of typical short-channel devices. Therefore, the current values of a 20 nm wide device are computed as the difference between current values of a 1000 nm and 1020 nm devices. This eliminates repeated counting of the end effects, such as width correction. Further, in the lookup table, length is varied at the granularity of 1 nm, while width is linearly interpolated, in order to reduce the size of the lookup table.

The nature of the index will depend on the feature and performance characteristic under consideration. For example, if the performance characteristic is capacitance between wires, then the relevant index may be the different widths of wires, and the spacing between the pairs of wires. The lookup table approach may also be combined with a real-time calculation approach. For example, a real-time calculation may be used to first calculate the shape of the gate and to rectilinearize its shape, and a lookup table approach may then be used to determine its effective length and width. Lookup tables of equivalent cells can also be constructed. The pre-defined sets of equivalent cells can be contained in other types of data structures. In one approach, the data set is constructed in a real-time environment. For example, the first time a cell X is encountered, its equivalent cell may be calculated and added to a data structure. If the cell X is encountered elsewhere on the integrated circuit, then the stored equivalent cell X is retrieved rather than re-determining the equivalent layout.

In accordance with another embodiment of the present invention, a more complex approach is used to determine equivalence. It is known that slices that are closer to the edges of the lithography-simulated layout of the gate typically suffer from line-end and narrow-width like effects. As a result, the slices that are closer to the edges are assigned a different weight for purposes of total Ion or Ioff computation. An exemplary weighting function of the end is around z=0 is $$wt(z) = 1 + a*(b-z) \text{ for } z < b \quad (29)$$

$$wt(z) = 1 \text{ for } z > b \quad (30)$$

where z is the distance of the slice from the end of the device
b is the extent of the edge effect (for example, 60 nm), and
a is a fitting parameter.

The parameters a and b typically depend on the length of the line end.

It will be apparent to a person skilled in the art that a similar approach may also be used to determine equivalence for contacts and vias. In various embodiments of the present invention, misalignment of a contact, due to lithography effects is accounted for with an equivalent resistive model of a contact. Typically, the performance characteristic of interest in the case of contacts is the resistance. The main effect caused by lithography is misalignment of the contact with the adjoining conductive layers of polysilicon and metal. In the case of the vias, there is misalignment between the adjoining metal layers.

Various embodiments of the present invention offer the following advantages. Various embodiments of the invention determine equivalent layouts of elements in an integrated circuit design. The equivalent layouts are equivalent in terms of one or more performance characteristics. Further, the equivalent layouts are in a form that can be analyzed by existing circuit analysis tools. While determining the equivalent layouts, repetitive or identical parts of the layout are replaced with their corresponding equivalent layout, thereby reducing the time and computation effort required. Further, the present invention makes it possible to close the loop from lithography simulation back to the performance analyses and optimizations by the know circuit analysis tools.

The system for designing an integrated circuit, as described in the present invention, or any of its components, may be embodied in the form of a computer system. Typical examples of a computer system includes a general-purpose computer, a programmed microprocessor, a micro-controller, a peripheral integrated circuit element, and other devices or arrangements of devices that are capable of implementing the steps that constitute the method of the present invention.

The computer system comprises a computer, an input device, a display unit, and the Internet. The computer comprises a microprocessor, which is connected to a communication bus. The computer also includes a memory, which may include Random Access Memory (RAM) and Read Only Memory (ROM). The computer system further comprises a storage device. It can be a hard disk drive or a removable storage drive such as a floppy disk drive, optical disk drive, and so forth. The storage device can also be other similar means of loading computer programs or other instructions into the computer system.

The computer system executes a set of instructions that are stored in one or more storage elements, in order to process input data. The storage elements may also hold data or other information, as desired. The storage element may be in the form of an information source or a physical memory element present in the processing machine. Exemplary storage elements include hard disk, DRAM, SRAM and EPROM. The storage element may also be external to the computer system, and connected to or inserted into the computer, for download at or prior to the time of use. Examples of such external computer program products are computer-readable storage mediums such as CD-ROMS, Flash chips, floppy disks, and so forth.

The set of instructions may include various commands that instruct the processing machine to perform specific tasks, such as the steps that constitute the method of the present invention. The set of instructions may be in the form of a software program. The software may be in various forms, such as system software or application software. Further, the software might be in the form of a collection of separate programs, a program module with a larger program, or a portion of a program module. The software might also include modular programming in the form of object-oriented programming. The software program containing the set of instructions can be embedded in a computer program product, for use with a computer. The computer program product comprising a computer-usable medium having a computer-readable program code embodied therein. The processing of input data by the processing machine may be in response to user commands or in response to results of previous processing, or in response to a request made by another processing machine.

While the foregoing is directed at embodiments of the present invention, other and further embodiments of the invention may be devised, without departing from the basic scope thereof, and the scope thereof is determined by the claims that follow.

The invention claimed is:

1. A method for designing an integrated circuit, the integrated circuit comprising a plurality of elements, the method comprising:
    obtaining a lithography-simulated layout corresponding to at least one element of the plurality of elements in the integrated circuit, wherein the lithography-simulated layout includes simulated effects of lithography on the at least one element;
    determining an equivalent circuit representation corresponding to the lithography-simulated layout with respect to one or more performance characteristics and based on user preferences, wherein the equivalent circuit representation is in a form suitable for use by circuit analysis tool; and
    providing the equivalent circuit representation to the circuit analysis tool to analyze the one or more performance characteristics of the at least one element;
    wherein the step of determining the equivalent circuit representation includes selecting the equivalent circuit representation from a library based on the lithography-simulated layout, the one or more performance characteristics, and the user preferences such that the equivalent circuit representation and the lithography-simulated layout exhibit similar behavior for the one or more performance characteristics, wherein the library comprises one or more pre-defined element representations for a plurality of elements, wherein each method operation is executed by a processor.

2. The method of claim 1, wherein the step of obtaining a lithography-simulated layout comprises:
    obtaining a drawn layout corresponding to the at least one element of the plurality of elements;
    obtaining a pre-lithography design representation of the integrated circuit, wherein the pre-lithography design representation comprises a netlist representation of the drawn layout; and
    simulating lithography effects onto the drawn layout to produce the lithography-simulated layout of the at least one element from the plurality of element; and
    generating a post-lithography design representation of the integrated circuit, wherein the post-lithography design representation comprises a netlist representation of the lithography-simulated layout.

3. The method of claim 1, wherein the plurality of elements form a cell, wherein selecting the equivalent circuit representation from the library includes selecting an equivalent circuit representation for the cell.

4. The method of claim 3, wherein the performance characteristics for the cell is one or more effective cell lengths, wherein the each of the one or more effective cell lengths corresponds to one element contained in the cell.

5. The method of claim 1, wherein the one or more performance characteristics are selected from a group consisting of leakage power, timing delay, propagation delay, capacitance, or resistance.

6. The method of claim 1, wherein the user preferences include selection of the circuit analysis tool.

7. The method of claim 1, wherein the equivalent circuit representation is an equivalent circuit netlist of the lithography-simulated layout.

8. The method of claim 1, wherein the plurality of elements comprise a wire, wherein the equivalent circuit has an equivalent resistance for the wire of the lithography-simulated layout.

9. The method of claim 1, wherein the plurality of elements comprise a wire, wherein the equivalent circuit has an equivalent capacitance for the wire of the lithography-simulated layout.

10. A method for designing an integrated circuit, the integrated circuit comprising a plurality of elements, the method comprising:
- obtaining a lithography-simulated layout corresponding to at least one element of the plurality of elements in the integrated circuit, wherein the lithography-simulated layout includes simulated effects of lithography on the at least one element, the obtaining including generating a post-lithography design representation that has a netlist representation of the lithography-simulated layout;
- determining an equivalent circuit representation corresponding to the lithography-simulated layout with respect to one or more performance characteristics and based on user preferences, wherein the equivalent circuit representation is in a form suitable for use by circuit analysis tool;
- providing the equivalent circuit representation to the circuit analysis tool to analyze the one or more performance characteristics of the at least one element;
- wherein the step of determining the equivalent circuit representation includes selecting the equivalent circuit representation from a library based on the lithography-simulated layout, the one or more performance characteristics, and the user preferences such that the equivalent circuit representation and the lithography-simulated layout exhibit similar behavior for the one or more performance characteristics, wherein the library comprises one or more pre-defined element representations for a plurality of elements, wherein each of the one or more pre-defined element representations in the library is associated with performance information about the integrated circuit; and
- replacing the selected equivalent circuit representation in a post-lithography design database, wherein each method operation is executed by a processor.

11. A method for designing an integrated circuit, the integrated circuit comprising a plurality of elements, the method comprising:
- obtaining a lithography-simulated layout corresponding to at least one element of the plurality of elements in the integrated circuit, wherein the lithography-simulated layout includes simulated effects of lithography on the at least one element, the obtaining including generating a post-lithography design representation that has a netlist representation of the lithography-simulated layout;
- determining an equivalent circuit representation corresponding to the lithography-simulated layout with respect to one or more performance characteristics and based on user preferences, wherein the equivalent circuit representation is in a form suitable for use by circuit analysis tool; and
- providing the equivalent circuit representation to the circuit analysis tool to analyze the one or more performance characteristics of the at least one element;
- wherein the step of determining the equivalent circuit representation includes selecting the equivalent circuit representation from a library based on the lithography-simulated layout, the one or more performance characteristics, and the user preferences such that the equivalent circuit representation and the lithography-simulated layout exhibit similar behavior for the one or more performance characteristics, wherein the library comprises one or more pre-defined element representations for a plurality of elements, and further comprising,
- replacing the post-lithography design representation with an interpolated design representation in a post-lithography design database, wherein the interpolated design representation is generated based on interpolation of a design representation stored in a library, wherein each method operation is executed by a processor.

12. The method of claim 11, wherein the plurality of elements form a cell, wherein selecting the equivalent circuit representation from the library includes selecting an equivalent circuit representation for the cell.

13. The method of claim 12, wherein the performance characteristics for the cell is one or more effective cell lengths, wherein the each of the one or more effective cell lengths corresponds to one element contained in the cell.

* * * * *